United States Patent
Williamson et al.

(10) Patent No.: US 6,936,821 B2
(45) Date of Patent: Aug. 30, 2005

(54) AMPLIFIED PHOTOCONDUCTIVE GATE

(75) Inventors: Steven L. Williamson, Ann Arbor, MI (US); James V. Rudd, Ann Arbor, MI (US); David Zimdars, Ann Arbor, MI (US); Matthew Warmuth, Tulsa, OK (US); Artur Chernovsky, Ann Arbor, MI (US)

(73) Assignee: Picometrix, Inc., Ann Arbor, MI (US)

( * ) Notice: Subject to any disclaimer, the term of this patent is extended or adjusted under 35 U.S.C. 154(b) by 133 days.

(21) Appl. No.: 10/307,085

(22) Filed: Nov. 29, 2002

(65) Prior Publication Data

US 2003/0127673 A1 Jul. 10, 2003

Related U.S. Application Data

(60) Provisional application No. 60/334,549, filed on Nov. 29, 2001.

(51) Int. Cl.$^7$ ................................................. G01J 5/20
(52) U.S. Cl. .................................................. 250/338.4
(58) Field of Search ...................... 250/338.4; 324/753

(56) References Cited

U.S. PATENT DOCUMENTS

| | | | |
|---|---|---|---|
| 4,952,527 A | 8/1990 | Calawa et al. | |
| 5,729,017 A | 3/1998 | Brener et al. | |
| 5,789,750 A | 8/1998 | Nuss | |
| 6,111,416 A | * 8/2000 | Zhang et al. | ............ 324/753 |

OTHER PUBLICATIONS

Jiunn–Ren Hwang, Heng–ju Cheng and John F. Whitaker, Photoconductive Sampling With an Integrated Source Follower/Amplifier, Published Jan. 8, 1996, American Institute of Physics, pp. 1464–1466.

* cited by examiner

*Primary Examiner*—David Porta
*Assistant Examiner*—Marcus Taningco
(74) *Attorney, Agent, or Firm*—Brinks Hofer Gilson & Lione

(57) ABSTRACT

The present invention includes a semiconductor epitaxial structure optimized for photoconductive free space terahertz generation and detection; and amplifier circuits for photoconductively sampled terahertz detection which may employ the optimized epitaxial structures.

28 Claims, 3 Drawing Sheets

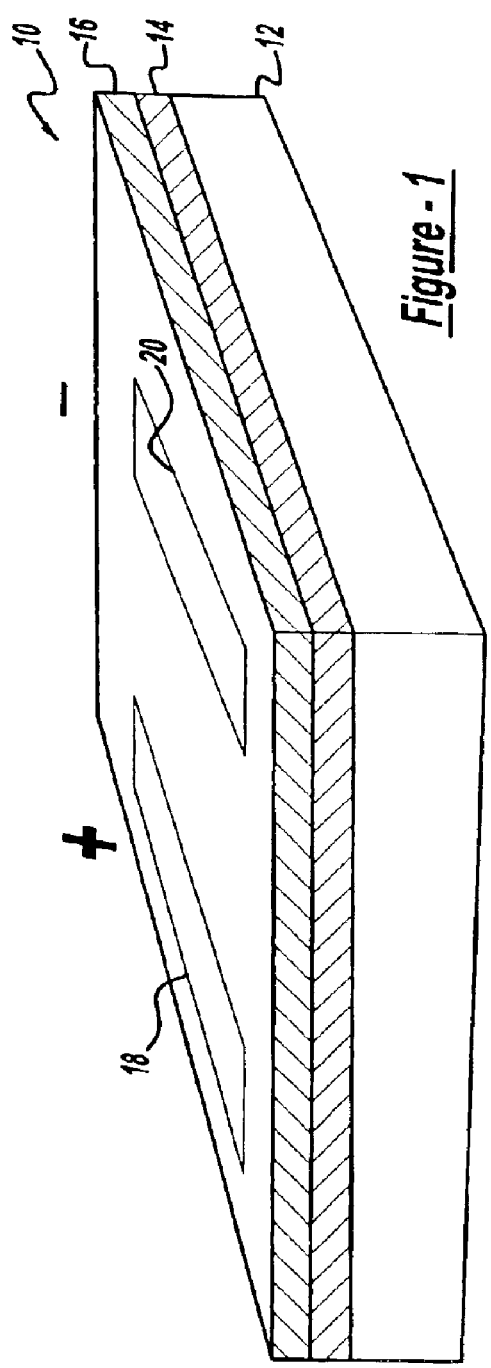
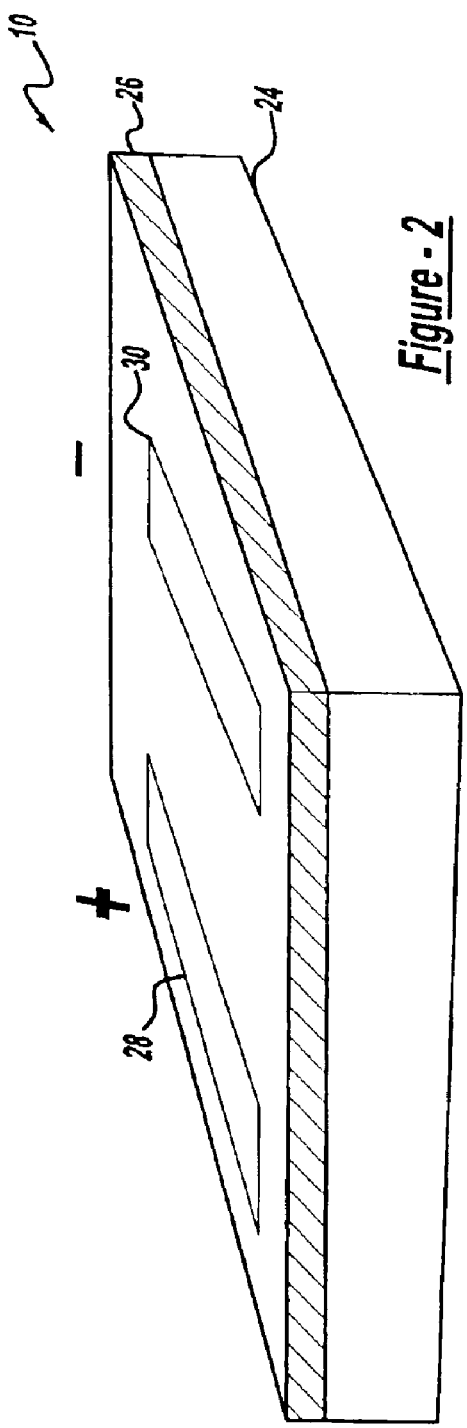

AMPLIFIED PHOTOCONDUCTIVE GATE

CROSS-REFERENCE TO RELATED APPLICATIONS

The present application claims priority to U.S. application No. 60/334,549, filed Nov. 29, 2001.

FIELD OF THE INVENTION

The present invention relates generally to the terahertz photoconductive sampling of optical signals, and more particularly to an optimized epitaxial photoconductive structure and associated voltage amplifier for such sampling.

BACKGROUND AND SUMMARY OF THE INVENTION

Epitaxial structures of low temperature grown gallium arsenide (GaAs) photoconductive devices can be tailored to the specific and differing needs of both free-space terahertz generation and free-space terahertz sampling. Low temperature GaAs can also be grown as a heterostructure with a tailored growth profile. When grown at approximately 600° C., GaAs has a recombination rate on the order of 1 nanosecond. Under these conditions, the strucutre is its natural or stoichiometric state, and has equal quantities of Ga and As forming the lattice.

It is also known that lowering the growth temperature to approximately 200° C. causes the As concentration to increase relative to Ga, forming a nonstoichiometric structure. A subsequent annealing step at the usual growth temperature of 600° C. for 10 minutes creates a form of single-crystal GaAs that possesses high resistively, high mobility, and subpicosecond carrier lifetime—all of which make such a structure well-suited to terahertz generation and sampling. Nevertheless, the performance of a free space terahertz generation by a low temperature GaAs photoconductive device can be enhanced by growing a lattice-matched heterostructure formed of low temperature GaAs and aluminum gallium arsenide (AlGaAs) on top of a normal GaAs substrate.

The benefits of the AlGaAs are numerous. For example, the barrier layer created by the AlGaAs confines the photo-generated carriers to the low temperature GaAs region. Generally, the incident light is absorbed in the low temperature GaAs region, but carrier diffusion can force both electrons and holes out of this region and into the substrate, where they recombine at a rate of approximately one nanosecond. The AlGaAs layer will prevent any carriers from thermalizing or tunneling to the GaAs substrate. Low temperature AlGaAs has a subpicosecond carrier lifetime similar to LT-GaAs. Additionally, the AlGaAs barrier layer reduces the dark and illuminated current of a biased device by removing the conduction path through the GaAs substrate layer. The increased resistivity allows a greater bias to be applied with reduced chance of damage by current or heat dissipation in the biased region.

Sampling of a free space terahertz waveform occurs when the illuminated photoconductive gate conducts for a time shorter than the entire terahertz wave cycle. During the conduction period, charge flows from one side to another of a dipole antenna structure due to the potential difference induced by the terahertz wave. The amount of current flow per sampling optical pulse is proportional to the terahertz voltage potential and the off-state resistance of the interaction area. The antenna structure has an inherent capacitance, and unless the illumination is near saturation to bring the resistance very low, the resistance-capacitance RC time constant is long enough that the sub-picosecond conduction period will not fully equilibrate the capacitance to bring the instantaneous antenna potential difference to zero.

Any amplifier circuit connected to the terahertz antenna must have very high impedance at terahertz frequencies. Non-ideal amplifiers with low impedance at terahertz frequencies will serve to equilibrate charge in the antenna in response to the terahertz field without the action of the photoconductive gate.

The combined off-state resistance and impedance of the amplifier with the capacitance of the antenna, leads, and amplifier yield an RC time constant which limits the rate at which the optical sampling gate can be swept through repeated identical terahertz waveforms. If this RC time constant is too large, the recorded terahertz waveform will be distorted in frequency response, phase and amplitude. Differing combined circuits can be chosen for the best signal to noise and RC time constant to meet the scanning rate. Existing designs have time constants limiting the terahertz waveform scanning to less than 10 Hz corresponding to electrical bandwidths of 100 Hz. For many applications it is desirable to scan at 10,000 to 1000 Hz corresponding to electrical bandwidths up to 1 MHz.

The photoconductive-gated current can either be amplified by measuring the current or the off state voltage of the THz antenna which has been (repetitively) charged by the photoconductive current. The voltage across the antenna is proportional to the charge divided by the capacitance of the antenna.

Existing terahertz receivers are generally current amplifiers. Current amplifiers typically have low impedance and therefore a minimal RC time constant. However, they are typically used at very slow scanning speeds to achieve adequate signal to noise. When the illumination of the photoconductive region is well below saturation, or when a terahertz field is small, the amplifier noise current and any off-state noise current may be large in comparison to the actual current induced by the terahertz field. The mismatch in amplifier impedance with the off-state photoconductive device impedance may yield low signal to noise ratios. Current amplification can be used when the active area is strongly illuminated and slow scanning speeds are used. These amplifiers are also ideal for systems where stray capacitance is present and slow scan speeds are acceptable.

The current state of the art employs a photoconductive gate/antenna assembly simply as a current source for an external amplifier. Integration and signal averaging occur after the external amplifier. At low signal levels, the noise floor of a current amplifier is sufficiently high limits the sensitivity of the device. Moreover, because current amplifiers are not integral to the photoconductive gate/antenna assembly, the connecting wires increased the inherent capacitance in the system and adversely affected the response time of the assembly. As such, there is a need in the art for an integrated photoconductive gate and amplifier assembly in which the response time is optimized and the signal to noise ratio is maximized.

Accordingly, the present invention includes an amplified photoconductive gate having an integrated antenna and voltage amplifier. Voltage amplifiers can yield superior signal to noise because their input impedance can be large and match the large impedance of the photoconductive sampling gate. When the illumination of the gate is well below saturation, the large amplifier impedance allows the antenna amplifier circuit capacitance to reach equilibrium as driven by the repeated terahertz potential on the antenna during the sample gate. This multi-sample integration allows the antenna voltage to rise well above that of a single sample. Furthermore, by reducing the stray capacitance inherent in cabling, equilibrium can be reached in a minimal number of illuminations, thus allowing rapid scanning of the signal.

Voltage amplifiers can be integrated into a single housing with the photoconductive antenna. Integrating a low-input capacitance amplifier with the terahertz receiver increases sampling speeds, lowers the cost, and improves product robustness over the use of a typical current preamplifier. The signal-to-noise ratio achieved with voltage amplifiers is equal to or better than that achieved by systems employing current amplifiers, while still gaining all of the noted benefits.

BRIEF DESCRIPTION OF THE DRAWINGS

FIG. 1 is a diagrammatic illustration of a terahertz photoconductive semiconductor epitaxial structure having a barrier layer.

FIG. 2 is a diagrammatic illustration of a terahertz photoconductive semiconductor epitaxial structure.

DETAILED DESCRIPTION OF THE PREFERRED EMBODIMENT

Figure 3:
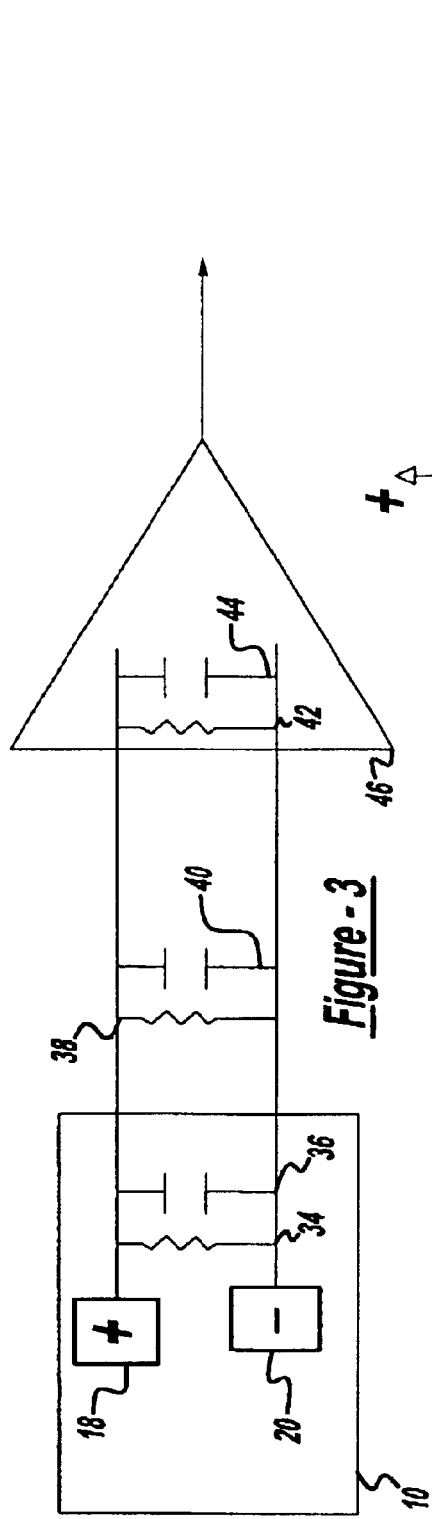
FIG. 3 is a schematic diagram of an equivalent terahertz photoconductive sampled voltage amplifier receiver circuit.

The present invention relates generally to the terahertz photoconductive sampling of optical signals utilizing a photoconductor and an associated amplifier. More particularly, the present invention relates to an optimized epitaxial photoconductive structure and associated voltage amplifier for such sampling, as discussed further herein.

FIG. 1 is a diagrammatic illustration of a terahertz photoconductive semiconductor epitaxial structure having a barrier layer, termed a photoconductive gate 10. The photoconductive gate 10 includes a substrate 12 composed of GaAs. A barrier layer 14 is disposed between the substrate 12 and the photoconductive layer 16. A bipolar terahertz antenna comprised of a first pole 18 and a second pole 20 is disposed on the photoconductive layer 16. Although the first pole 18 is designated positive and the second pole 20 is designated negative, it is understood that the respective charges of the poles of the terahertz antenna may be reversed.

As noted, the substrate 12 is preferably composed of intrinsic GaAs. Alternatively, the substrate 12 may be composed of Indium Arsenide (InAs), Indium Gallium Arsenide (InGaAs), Indium Phosphate (InP), Silicon or Sapphire. The substrate 12 is preferably between 100 and 2000 microns in thickness.

The barrier layer 14 is one of AlGaAs or low temperature AlGaAs. The barrier layer 14 has a preferred thickness between 0.4 and 0.6 microns, and is preferably composed of 70% aluminum. The photoconductive layer 16 is preferably low temperature GaAs having a thickness between 0.5 and 2 microns. Alternatively, the photoconductive layer is low temperature InGaAs or Silicon-on-Sapphire, both of which are suitable for generating sub-picosecond carrier lifetimes. In an alternative embodiment, a second barrier layer 14 composed of AlGaAs or low temperature AlGaAs is grown on the photoconductive layer 16 in order to optimize the performance of the photoconductive gate 10.

FIG. 2 shows a diagrammatic illustration of a terahertz photoconductive semiconductor epitaxial structure in which there is no barrier layer. In this example, a photoconductive gate 10 is comprised of a substrate 24 supporting a photoconductive layer 26. The substrate 24 is preferably composed of intrinsic GaAs. Alternatively, the substrate 24 may be composed of InAs, InGaAs, InP, Silicon or Sapphire. The substrate 12 is preferably between 100 and 2000 microns in thickness. The photoconductive layer 26 is preferably low temperature GaAs having a thickness between 0.5 and 2 microns. Alternatively, the photoconductive layer is low temperature InGaAs or Silicon-on-Sapphire, both of which are suitable for generating sub-picosecond carrier lifetimes.

As before, a bipolar terahertz antenna comprised of a first pole 28 and a second pole 30 is disposed on the photoconductive layer 26. Although the first pole 28 is designated positive and the second pole 30 is designated negative, it is understood that the respective charges of the poles of the terahertz antenna may be reversed.

Figure 4:
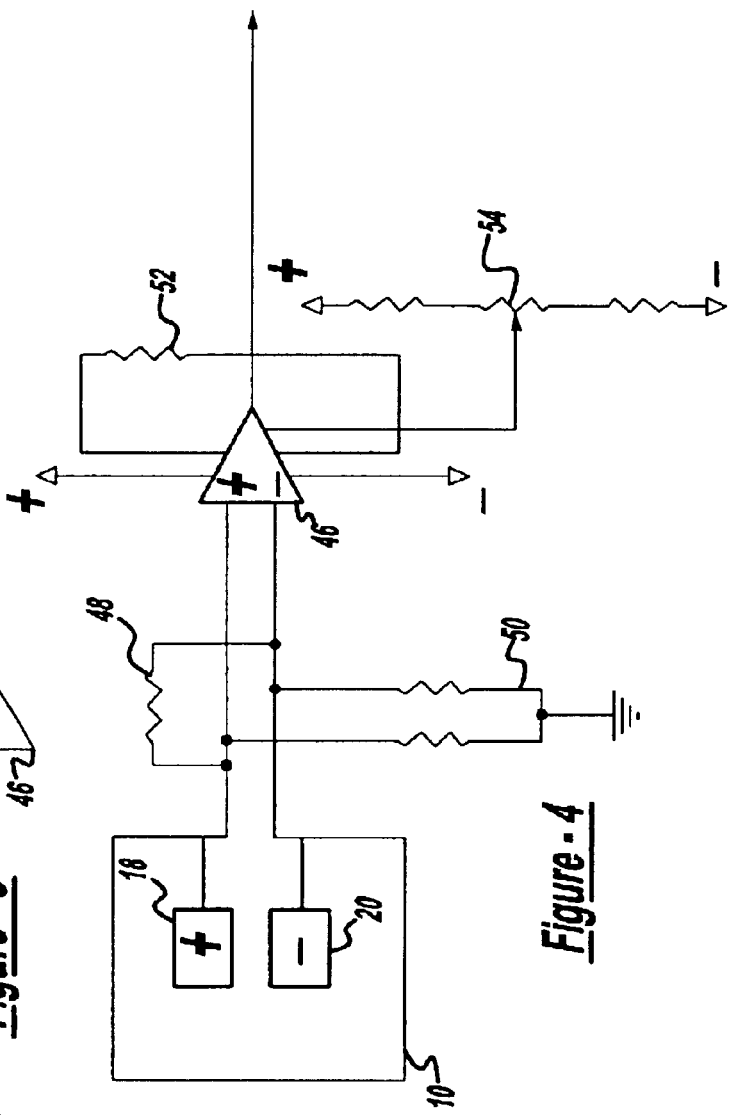
FIG. 4 is a schematic diagram of a single stage voltage amplified photoconductive sampled terahertz antenna receiver circuit.
Figure 5:
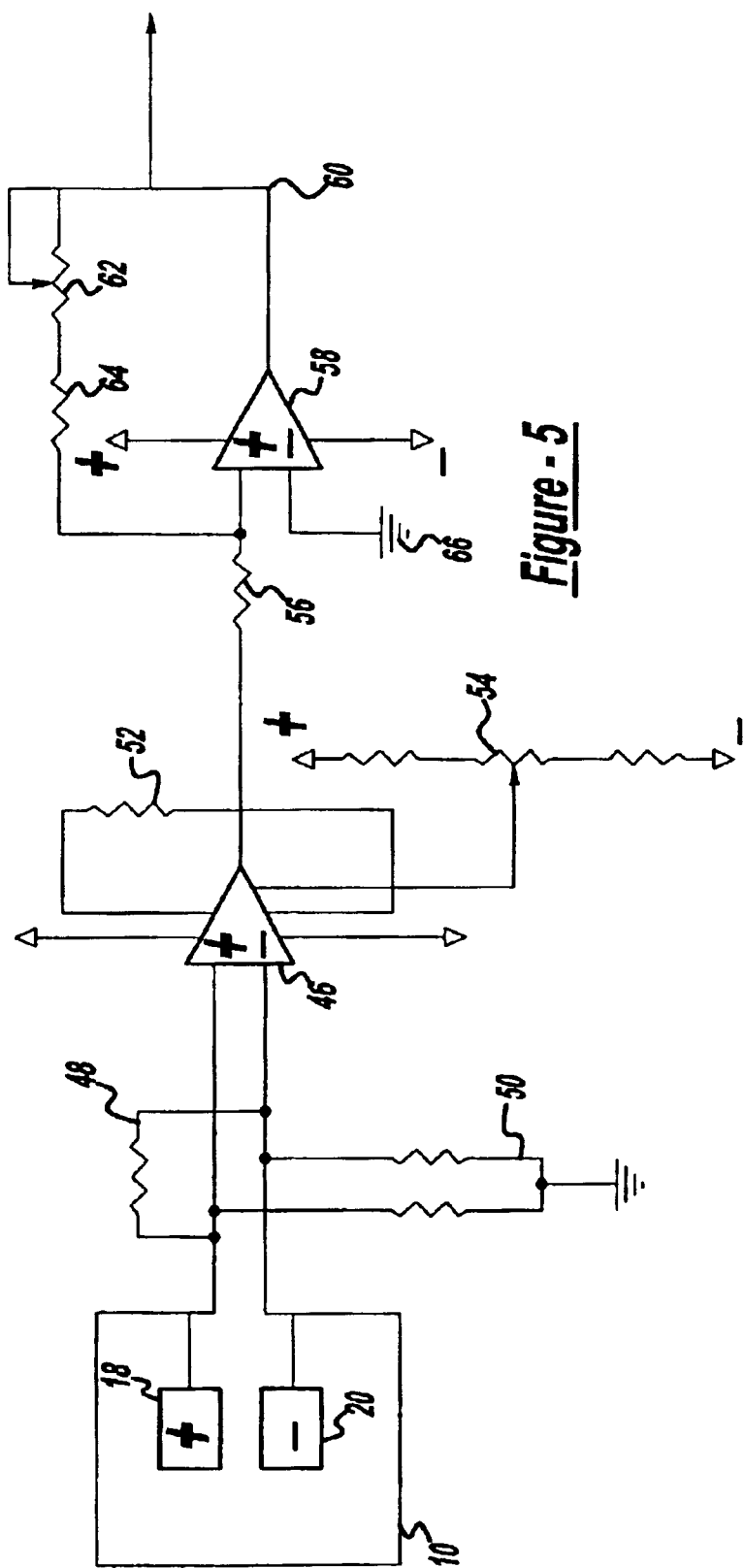
FIG. 5 is a schematic diagram of a high-speed, two-stage voltage-amplified photoconductive sampled terahertz antenna receiver circuit.

The photoconductive gate 10 and the respective terahertz antenna shown in FIGS. 1 and 2 may be coupled to one of three voltage amplifiers, depicted in FIGS. 3, 4 and 5.

FIG. 3 is a schematic diagram of an equivalent terahertz photoconductive sampled voltage amplifier receiver circuit. The photoconductive gate 10 is coupled to a bipolar terahertz antenna having a first pole 18 and a second pole 20. A resistor 34 and capacitor 36 are shown as illustrative of the inherent properties of the photoconductive gate and the terahertz antenna. The resistor 34 ($R_{PC}$) is indicative of the limiting resistance of the photoconductive gate with respect to the overall time constant, $RC_{RECEIVER}$. The capacitor 36 ($C_{ANT}$) represents the terahertz antenna capacitance, which is typically 0.1 to 0.5 pF The leads from the first pole 18 and the second pole 20 are coupled to an external resistor 38 ($R_{EXT}$), the value of which is predetermined to control the overall time constant $RC_{RECEIVER}$. The maximum value of the external resistor 38 is the resistance between the leads from the first pole 18 and the second pole 20 to the instrumentation amplifier inputs. Similarly, an external capacitor 40 ($C_{EXT}$) is coupled to the first pole 18 and the second pole 20 for controlling the overall time constant, $RC_{RECEIVER}$. The external capacitor 40 typically has a value between 0.3 and 5 pF.

The leads from the first pole 18 and the second pole 20 are coupled to an instrumentation amplifier 46, which shows an instrument resistor 42 ($R_{AMP}$) indicative of the input impedance of the instrumentation amplifier, typically between $10^9$ and $10^{10}$ ohms. An instrument capacitor 44 ($C_{AMP}$) represents the input capacitance of the instrumentation amplifier, typically in the range of 0.5 to 20 pF.

If the gain of the instrumentation amplifier 46 is chosen such that the frequency response of instrumentation amplifier 46 alone is sufficiently high, the rate of response depends on the overall time constant $RC_{RECEIVER}$ of the receiver circuit.

The overall time constant, $RC_{RECEIVER}$, is determined by all of the input resistance and capacitance parameters of the equivalent circuit shown in FIG. 1.

$$RC_{RECEIVER} = R_{TOTAL} * C_{TOTAL} \quad (1)$$

$$R_{TOTAL} = 1/(1/R_{PC} + 1/R_{EXT} + R_{AMP}) \quad (2)$$

$$C_{TOTAL} = C_{ANT} + C_{EXT} + C_{AMP} \quad (3)$$

At high illumination and/or high optical repetition rate, the value $R_{PC}$ approaches a minimum value where the maximum number of charge carriers have been created between the photoconductive gate electrodes. At low illumination and/or low optical repetition rate, the value of $R_{PC}$ approaches a maximum value as shown.

$$R_{PC}=1/(1/R_{photo}(\text{Power,Rate})+1/R_{off}) \quad (4)$$

where $R_{photo}(\text{Power,Rate})$ is the reduced resistance of the photoconductive gate 10 induced by the optical illumination with pulses at a given power and rate. The value $R_{off}$ is proportional to the intrinsic resistance of the semiconductor epitaxial structure between the first pole 18 and the second pole 20 of the antenna.

The receiver circuit is optimized for high speed waveform sampling. High speed applications require minimizing $RC_{RECEIVER}$. This is done by either reducing $R_{TOTAL}$ or $C_{TOTAL}$. The capacitance of the antenna represented by capacitor 36 is fixed by a particular antenna design, and typically $C_{ANT}<C_{EXT}$ and $C_{ANT}<C_{AMP}$. The value of the external capacitor 40 can be minimized by reducing the connection lead length as much as possible. The minimum length would be achieved when the instrumentation amplifier 46 is fabricated on the photoconductive gate 10. Alternately, the amplifier can be housed in close proximity inside the same miniature electronic module.

In a typical system, $R_{AMP}$ is between $10^9$ and $10^{10}$ ohms and $R_{PC}$ is approximately $5\times10^7$ ohms. If $R_{EXT}>>R_{AMP}$, $R_{EXT}>>R_{PC}$, or both, and noting that $R_{AMP}>>R_{PC}$ in a preferred system, equation 1 can be approximated as:

$$RC_{RECEIVER}=R_{PC}*(C_{ANT}+C_{EXT}+C_{AMP}). \quad (5)$$

Usually, increasing the optical power or repetition rate is not practical. Equation 5 shows that $RC_{RECEIVER}$ can be minimized by tailoring the photoconductive gate 10 to achieve the desired time constant.

If it is not practical to alter the photoconductive gate 10, then the external resistor 38 is added where $R_{EXT}<R_{PC}$ and $R_{EXT}<R_{AMP}$, and the overall constant can be approximated as follows:

$$RC_{RECEIVER}=R_{EXT}*(C_{ANT}+C_{EXT}+C_{AMP}). \quad (6)$$

The external resistor 38 could be exterior to the photoconductive gate 10, or lithographically patterned on the die itself.

FIG. 4 is a schematic diagram of a single stage voltage amplified photoconductive sampled terahertz antenna receiver circuit. The photoconductive gate 10 is coupled to a bipolar terahertz antenna having a first pole 18 and a second pole 20. The first pole 18 and the second pole 20 are coupled to a bleedoff resistor pair 50 having two resistors tied to the ground state. Preferably the resistors in the bleedoff resistor pair 50 are of equal value, and that value is much greater than the inherent resistance of the photoconductive gate 10 in an off state ($R_{PC\ off}$). Given that the photoconductive gate is floating, the absolute voltage of each of the first pole 18 and the second pole 20 can drift outside the input range of the instrumentation amplifier 46 due to uneven charge buildup. The bleedoff resistor pair 50 thus drains the long term charge buildup. The leads from the first pole 18 and the second pole 20 are also coupled to an external resistor 48 to reduce the overall time constant.

The instrumentation amplifier 46 is coupled to a feedback resistor to set the instrumentation amplifier gain at a value between ten and one thousand. The instrumentation amplifier 46 is further coupled to an offset voltage divider 54 preferably comprising three resistors. The offset voltage divider 54 is used to trim the amplified output offset from ground to zero when no external signal is sampled by the photoconductive gate 10.

The instrumentation amplifier 46 preferably has large input impedance and it can be referenced to an external voltage. The input impedance should be chosen high enough that little current is drawn by the instrumentation amplifier 46. High CMMR of 100 dB allows the first pole 18 and the second pole 20 to float. As one side of the antenna is not directly connected to ground, noise current from the ground wiring cannot be introduced into photoconductive gate 10 and antenna poles 18, 20.

A single stage of amplification will achieve an optimized signal to noise ratio. Typical instrumentation amplifiers have maximum bandwidth at unity gain. The amplification necessary for terahertz signals may be greater than one thousand, which may reduce the bandwidth of the amplifier by several orders of magnitude. However, for slower speed applications, the reduced bandwidth may be adequate, and the superior signal to noise properties of a single stage amplifier can be used.

As such, the external resistor 48 is typically not necessary for the slower applications which can use a single stage amplifier circuit. As before, the external resistor 48 could be exterior to the photoconductive gate 10, or lithographically patterned on the die itself. The entirety of FIG. 4 is usable as a set of discrete elements in one or more housings, combined inside a single housing, or fabricated on a single microelectronic circuit.

FIG. 5 is a schematic diagram of a high-speed, two-stage voltage-amplified photoconductive sampled terahertz antenna receiver circuit. The photoconductive gate 10 is coupled to a bipolar terahertz antenna having a first pole 18 and a second pole 20. The first pole 18 and the second pole 20 are coupled to a bleedoff resistor pair 50 having two resistors tied to the ground state. Preferably the resistors in the bleedoff resistor pair 50 are of equal value, and that value is much greater than the inherent resistance of the photoconductive gate 10 in an off state ($R_{PC\ off}$). As the photoconductive gate is floating, the absolute voltage of each of the first pole 18 and the second pole 20 can drift outside the input range of the instrumentation amplifier 46 due to uneven charge buildup. The bleedoff resistor pair 50 thus drains the long term charge buildup. The leads from the first pole 18 and the second pole 20 are also coupled to an external resistor 48 to reduce the overall time constant.

The instrumentation amplifier 46 is coupled to a feedback resistor to set the instrumentation amplifier gain at a value between ten and one thousand. The instrumentation amplifier 46 is further coupled to an offset voltage divider 54 preferably comprising three resistors. The offset voltage divider 54 is used to trim the amplified output offset from ground to zero when no external signal is sampled by the photoconductive gate 10.

The instrumentation amplifier 46 is further coupled to a second stage operation amplifier 58 by a load resistor 56. The load resistor 56 is used to couple the output of the instrumentation amplifier 46 to the input of the second stage operation amplifier 58.

The second stage operation amplifier 58 is coupled to a feedback loop 60 preferably including resistors 62, 64 such that the gain is between ten and one hundred. Alternatively, the resistors 62, 64 are fixed resistors such that the gain is fixed.

As described above, the instrumentation amplifier 46 is used because its buffered inputs have large input impedance and it can be referenced to an external voltage. However, as noted the amplification necessary for terahertz signals may be greater than one thousand, which may reduce the bandwidth of the amplifier by several orders of magnitude. This may not be adequate for high speed terahertz waveform sampling In order to achieve sufficient combined amplifier bandwidth, the two stage amplifier of FIG. 5 can be used to maximize the frequency response. The gain of each of the instrumentation amplifier 46 and the second stage operation amplifier 58 is set such that the bandwidth of each amplifier alone can meet the desired minimum response time. In order to achieve the maximal signal to noise, the gain of the first stage through the instrumentation amplifier 46 should be maximized without sacrificing the desired total bandwidth. As before, the entirety of FIG. 5 is usable as a set of discrete elements in one or more housings, combined inside a single housing, or fabricated on a single microelectronic circuit.

As described, the present invention includes an optimized epitaxial photoconductive structure and associated voltage amplifier for the sampling of free space terahertz optical signals. Nevertheless, it should be apparent to those skilled in the art that the above-described embodiments are merely illustrative of but a few of the many possible specific embodiments of the present invention. Numerous and various other arrangements can be readily devised by those skilled in the art without departing from the spirit and scope of the invention as defined in the following claims.

What is claimed is:

1. An amplified photoconductive gate comprising:
   an epitaxial photoconductive structure;
   a biased bipolar terahertz antenna fabricated on the epitaxial photoconductive structure; and
   a differential voltage amplifier integrated to the bipolar terahertz antenna, the differential voltage amplifier being an instrumentation amplifier integrated circuit.

2. The amplified photoconductive gate of claim 1 wherein the biased bipolar terahertz antenna has a capacitance between 0.1 and 0.5 picofarads.

3. The amplified photoconductive gate of claim 1 further comprising bleedoff resistor pair including a first resistor and a second resistor, the first and second resistors coupled to a ground state for draining long-term charge buildup.

4. The amplified photoconductive gate of claim 3 wherein the first bleedoff resistor and the second bleedoff resistor are of equal value.

5. The amplified photoconductive gate of claim 1 wherein at least one amplifier inputs is coupled to a ground state.

6. The amplified photoconductive gate of claim 1 further comprising an external resistor coupling at least one amplifier inputs, the value of the external resistor selected such that the RC time constant is of a predetermined value.

7. The amplified photoconductive gate of claim 1 further comprising an external capacitor, wherein the capacitance of the external capacitor is between 0.3 and 5 picofarads.

8. The amplified photoconductive gate of claim 1 wherein the differential voltage amplifier has an input resistance and an input capacitance, wherein the input resistance is between $10^9$ and $10^{10}$ ohms, and the input capacitance is between 0.5 and 20 picofarads.

9. The amplified photoconductive gate of claim 1 wherein a gain value of the instrumentation amplifier is determined by a feedback resistor.

10. The amplified photoconductive gate of claim 9 wherein the value of the feedback resistor is variable.

11. The amplified photoconductive gate of claim 1 further comprising a variable voltage divider.

12. The amplified photoconductive gate of claim 1 wherein the epitaxial photoconductive gate includes a substrate layer and a photoconductive layer.

13. The amplified photoconductive gate of claim 12 wherein the substrate layer is one of InAs, InGaAs, InP, Si, Sapphire, or GaAs.

14. The amplified photoconductive gate of claim 12 wherein the substrate is intrinsic GaAs.

15. The amplified photoconductive gate of claim 12 wherein the photoconductive layer is between 0.5 and 2 microns in thickness.

16. The amplified photoconductive gate of claim 12 wherein the photoconductive layer is one of low temperature GaAs, low temperature InGaAs, or Silicon-on-Sapphire.

17. The amplified photoconductive gate of claim 12 wherein the photoconductive layer is low temperature GaAs.

18. An amplified photoconductive pate comprising:
    an epitaxial photoconductive structure;
    a biased bipolar terahertz antenna fabricated on the epitaxial photoconductive structure; and
    a differential voltage amplifier integrated to the bipolar terahertz antenna; and a second voltage amplifier circuit, the second amplifier circuit having a single-ended input.

19. The amplified photoconductive gate of claim 18 wherein the second amplifier circuit includes at least an operation amplifier integrated circuit.

20. The amplified photoconductive gate of claim 18 wherein the second voltage amplifier circuit is coupled to the differential voltage amplifier by a load resistor.

21. An amplified photoconductive gate comprising:
    an epitaxial photocnductive structure having a substrate layer and a photoconductive layer;
    a barrier layer disposed between the substrate layer and the photoconductive layer;
    a biased bipolar terahertz antenna fabricated on the epitaxial photoconductive structure; and
    a differential voltage amplifier integrated to the bipolar terahertz antenna.

22. The amplified photoconductive gate of claim 21 wherein the barrier layer is one of AlGaAs or low temperature AlGaAs.

23. The amplified photoconductive gate of claim 22 further comprising a second barrier layer disposed on the surface of the photoconductive layer.

24. The amplified photoconductive gate of claim 23 wherein the first barrier layer and the second barrier layer are of the same material.

25. The amplified photoconductive gate of claim 21 wherein the barrier layer is AlGaAs.

26. The amplified photoconductive gate of claim 21 wherein the barrier layer is low-temperature AlGaAs.

27. The amplified photoconductive gate of claim 21 wherein the barrier layer is between 0.4 and 0.6 microns in thickness.

28. The amplified photoconductive gate of claim 21 wherein the barrier layer is comprised of 70% aluminum.

* * * * *

UNITED STATES PATENT AND TRADEMARK OFFICE
CERTIFICATE OF CORRECTION

| | | |
|---|---|---|
| PATENT NO. | : 6,936,821 B2 | Page 1 of 1 |
| APPLICATION NO. | : 10/307085 | |
| DATED | : August 30, 2005 | |
| INVENTOR(S) | : Steven L. Williamson et al. | |

It is certified that error appears in the above-identified patent and that said Letters Patent is hereby corrected as shown below:

<u>On the Title Page, Item [56]</u>:

In column 2, line 1, under "OTHER PUBLICATIONS", delete "Heng-ju" and substitute --Heng-Ju-- in its place.

<u>In the Claims</u>

Column 8, in claim 18, line 1, before "comprising:" delete "pate" and substitute --gate-- in its place.

Column 8, in claim 21, line 2, before "structure having a" delete "photocnductive" and substitute --photoconductive-- in its place.

<u>Title page,</u>
Item [56], References Cited, OTHER PUBLICATIONS,
"Heng-ju" reference, delete "Heng-ju" and substitute -- Heng-ju --.

<u>Column 8,</u>
Line 1, before "comprising:" delete "pate" and substitute -- gate --.
Line 2, before "structure having a" delete "photocnductive" and substitute -- photoconductive --.

Signed and Sealed this

Twenty-second Day of August, 2006

JON W. DUDAS
*Director of the United States Patent and Trademark Office*